(12) United States Patent
Campbell

(10) Patent No.: US 11,419,225 B2
(45) Date of Patent: Aug. 16, 2022

(54) FLUSH-MOUNTED CONTROL PANELS FOR BATHING INSTALLATIONS

(71) Applicant: Balboa Water Group, LLC, Costa Mesa, CA (US)

(72) Inventor: Graham J. Campbell, Irvine, CA (US)

(73) Assignee: Balboa Water Group, LLC, Costa Mesa, CA (US)

( * ) Notice: Subject to any disclaimer, the term of this patent is extended or adjusted under 35 U.S.C. 154(b) by 365 days.

(21) Appl. No.: 16/746,616

(22) Filed: Jan. 17, 2020

(65) Prior Publication Data

US 2021/0227707 A1    Jul. 22, 2021

(51) Int. Cl.
*H05K 5/02* (2006.01)
*A47K 3/00* (2006.01)
*H02G 3/08* (2006.01)
*H05K 5/00* (2006.01)

(52) U.S. Cl.
CPC ........... *H05K 5/0204* (2013.01); *A47K 3/001* (2013.01); *H02G 3/081* (2013.01); *H05K 5/0017* (2013.01)

(58) Field of Classification Search
CPC .................................................. H05K 5/0204
USPC ..................................... 4/580, 559
See application file for complete search history.

(56) References Cited

U.S. PATENT DOCUMENTS

| | | | |
|---|---|---|---|
| 5,813,431 A | 9/1998 | Cool et al. | |
| 6,317,717 B1 * | 11/2001 | Lindsey | F16K 37/0058 4/623 |
| 8,220,083 B2 | 7/2012 | Strickland | |
| 8,549,678 B2 | 10/2013 | Neidich et al. | |
| 8,550,643 B2 | 10/2013 | Kownacki et al. | |
| 10,017,896 B2 * | 7/2018 | Bing | H05K 5/0017 |
| 10,514,722 B1 * | 12/2019 | Artwohl | A47F 3/043 |
| 2003/0208841 A1 | 11/2003 | Marks | |
| 2009/0106890 A1 | 4/2009 | Rosenau | |
| 2014/0340872 A1 | 11/2014 | Campbell | |
| 2017/0292219 A1 * | 10/2017 | Bing | H05K 5/0017 |

* cited by examiner

*Primary Examiner* — Lori L Baker
(74) *Attorney, Agent, or Firm* — Larry K. Roberts

(57) ABSTRACT

A flush-mounted control panel system for a bathing installation. The panel system includes a control panel including a housing structure, the housing structure including a peripheral mounting flange, the panel and flange sized to fit within a tub mounting opening in a mounting surface. A support bracket supports the control panel within the opening, and is fabricated of a thin material. The bracket has a peripheral sidewall portion, a top lip portion extending outwardly from the sidewall portion, and a bottom lip portion extending inwardly from the sidewall portion. The top lip portion overlays a portion of the surface peripheral to the opening and the bottom lip portion underlays the peripheral flange of the panel housing to support the panel within the opening. Adhesive gaskets secure the bracket to the mounting surface and the panel flange to the bottom lip portion.

20 Claims, 6 Drawing Sheets

FLUSH-MOUNTED CONTROL PANELS FOR BATHING INSTALLATIONS

BACKGROUND

Bathing installations such as spas and whirlpool baths typically employ a control panel for the user to control operation of the installation and/or view status information. The control panel may be mounted into an opening formed in the top surface of the tub of the installation, and a panel mounting flange secured to the top surface by adhesive or mechanical fasteners. However, the panel mounting flange, typically an integral part of the panel housing structure, has some appreciable thickness and so the panel protrudes above the surface, exposing the panel to risk of damage, and affecting the aesthetic appearance of the control panel and the installation.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION

Figure 1:
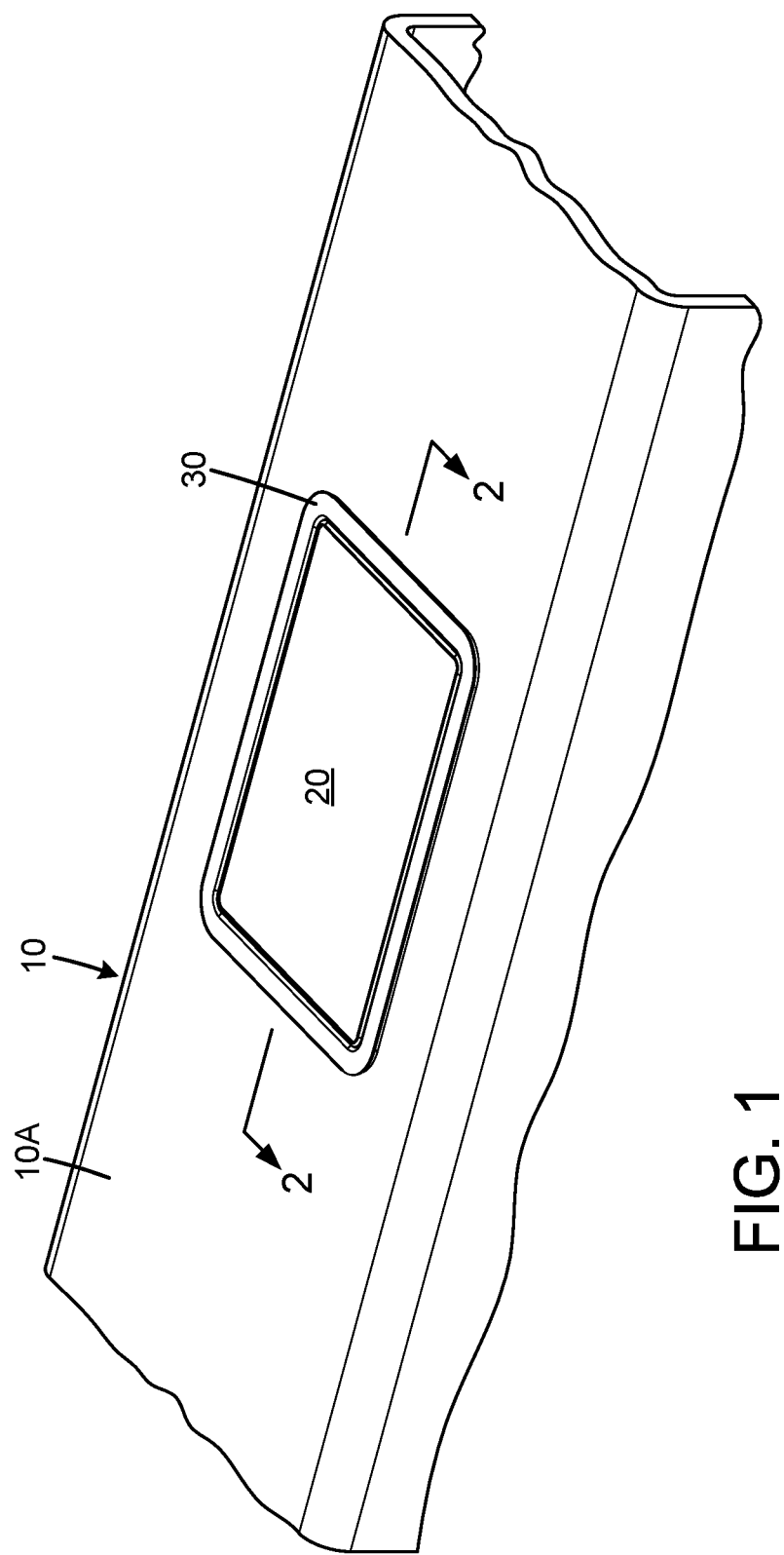
FIG. 1 is a diagrammatic isometric view of an exemplary embodiment of a control panel installed in a bathing installation tub in accordance with aspects of the invention.

In the following detailed description and in the several figures of the drawing, like elements are identified with like reference numerals. The figures may not be to scale, and relative feature sizes may be exaggerated for illustrative purposes.

FIGS. 1-4 illustrate an exemplary embodiment of an essentially flush-mounted user-interface panel 20 on a top surface 10A of a bathing installation tub 10. Typically, the tub is fabricated of molded acrylic with fiberglass reinforcement. Other surfaces of the bathing installation may also be suitable for installation of the control panel 20 in accordance with aspects of the invention. In this embodiment, the panel 20 has a rectangular configuration, but other embodiments may have an elliptical, circular or other configuration. The panel 20 typically includes a display for displaying information to the user, as well as touch or pressure sensitive areas for the user to enter commands or other inputs to the bathing installation controller. For the sake of clarity, the display and touch or pressure sensitive areas are not separately depicted. The panel is typically electrically connected to a spa pack with a controller; the electrical connection is also not illustrated for clarity. The top surface 20D of the control panel is flat and essentially planar in this exemplary embodiment. In other embodiments, the top surface may have a curvature, or there may be variations from flat.

Figure 2:
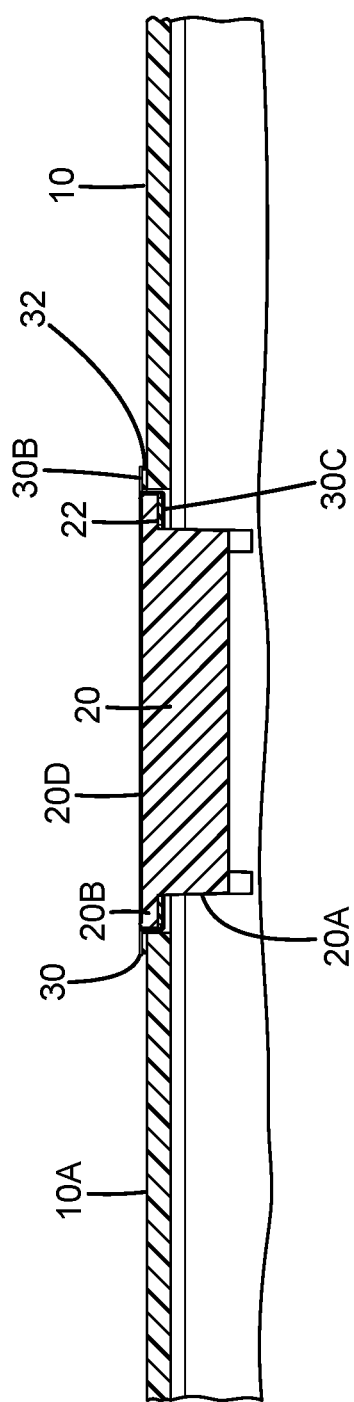
FIG. 2 is a cross-sectional view of the panel installation of FIG. 1.
Figure 2A:
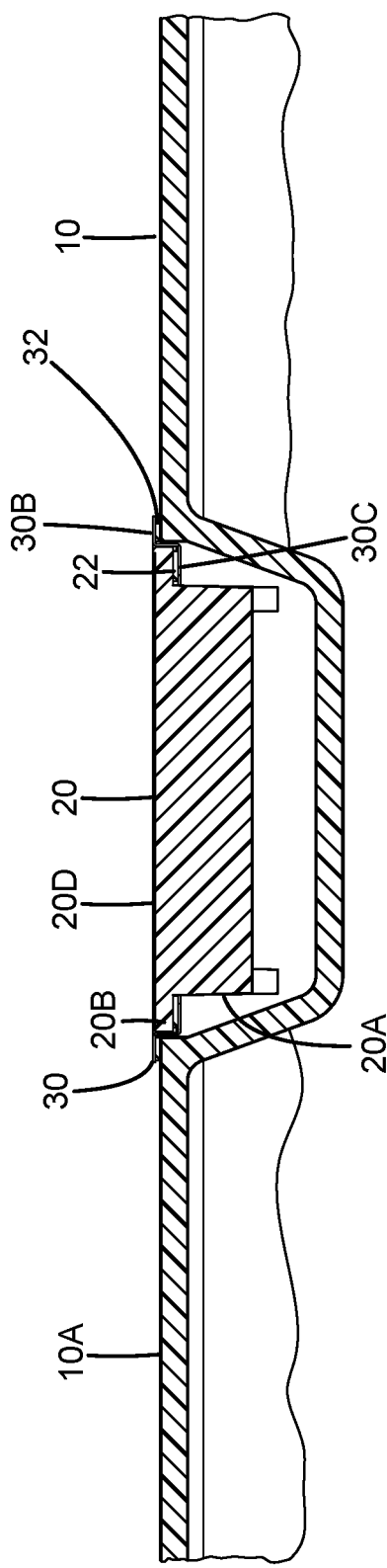
FIG. 2A shows an alternate form of the tub, in which a recess is formed in the mount surface instead of an opening.
Figure 3:
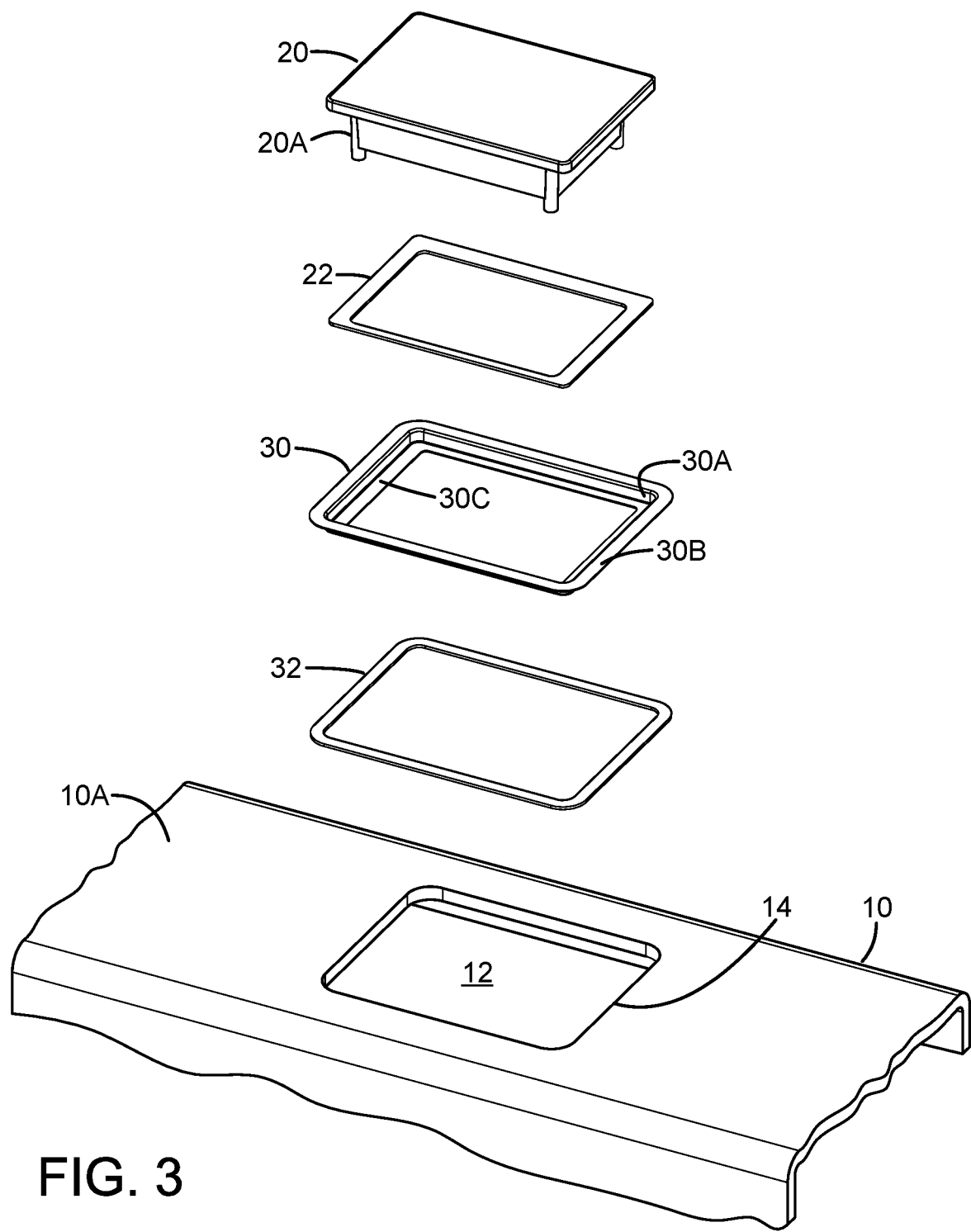
FIG. 3 is an isometric exploded view of the panel installation of FIG. 1
Figure 4:
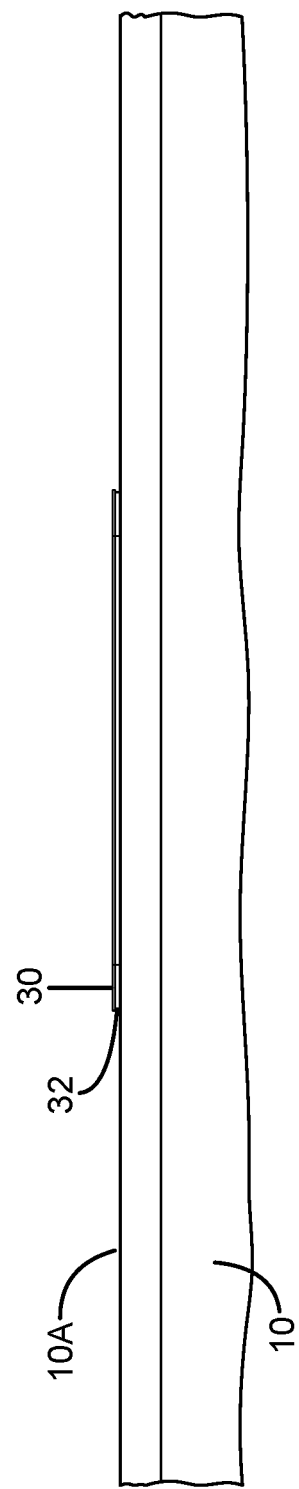
FIG. 4 is a side view of the panel installation of FIG. 1.

The panel 20 is fitted into an opening 14 (FIG. 3) formed in surface 10A of the tub. The opening 14 can be formed by cutting into the spa surface or by a recess molded into the surface. FIG. 2 illustrates an opening cut out of the surface 10. FIG. 2A illustrates the opening defined by a recess molded into the surface, thereby avoiding the need to cut an opening. The installer need only drill a hole for the electrical connection to the panel to be passed, rather than cutting the larger opening. The panel includes a housing structure 20A, from which an integrally formed peripheral flange 20B protrudes (FIG. 2). The opening 14 is slightly oversized with respect to the outer perimeter of the flange, so that the panel fits through the opening.

A peripheral support bracket 30 is provided to engage the edge of the surface 10A around the opening 14. In an exemplary embodiment, the support bracket is a unitary thin metal structure, fabricated of stainless steel stamped into the illustrated shape. An exemplary thickness of the metal is 0.028 inch, although other thicknesses may be used. Alternatively, the bracket may be a molded plastic bracket. The bracket includes a peripheral sidewall 30A, a top peripheral top lip 30B extending outwardly from the top edge of the sidewall, and a bottom lip structure 30C extending inwardly from the bottom edge of the sidewall. The top lip structure is sized to overlap the edge of the surface 10A around the opening, by a sufficient amount to securely support the bracket 30. A typical overlap dimension is in the range of 0.25 inch to 0.33 inch. The top peripheral lip is fabricated of a sufficiently strong material to support the panel from users pushing on it, sitting on it and stepping on it. A minimal clearance is provided between the sidewall of the bracket and the edge of the opening; the clearance will typically depend on how the opening is formed.

The bottom lip 30C extends inwardly by a sufficient lateral distance to underlie and support the flange 20B of the panel housing as shown in FIG. 2. A typical lateral dimension for the bottom lip is 0.20 inch.

In an exemplary embodiment, the top and bottom lips 30B and 30C are each planar and lie in planes parallel to each other. The sidewall portion need not be perpendicular to the surface 10A, but may have some angular offset. The bottom lip need not be parallel to the top lip, as there can be an offset while still providing the necessary support.

In an exemplary embodiment, the panel attachment system includes a first adhesive seal or gasket 32 sized to fit under the top peripheral lip 30B of the bracket to secure the bracket to the surface 10A of the tub 10. A second adhesive seal or gasket 22 is sized to fit between the bottom lip 30C of the bracket and the bottom surface of the panel housing flange 20B, to secure the panel housing to the bottom lip. In an exemplary embodiment the gasket 32 is preferably suitably thin, e.g. 0.060 inch in thickness, so as to minimize the distance the top lip 30B extends above the surface 10A. A suitable thickness for gasket 22 is 0.060 inch.

The adhesive gaskets 22 and 32 include a waterproof adhesive material to prevent water from entering through the opening 14 into the underside of the surface 10A. Suitable gaskets with waterproof adhesives are commercially available, e.g. Grades of 3M VHB (TM) double sided tapes. Other embodiments may employ a dispensed adhesive surrounding the opening 14 in place of a gasket, such as a silicone bead formed on the periphery of the opening 14.

The sidewall 30A of the bracket 30 has a depth dimension between the top and bottom lips which is sized to ensure that the top 20D of the panel 20 does not protrude above the plane of the top lip 30B, with the adhesive gasket 22 and the panel in place and supported by the gasket. This will of course be dependent on the thickness of the flange 20B and that of the gasket 22. In an exemplary embodiment, the flange has a thickness of 0.028 inch, and the gasket a thickness of 0.060 inch.

The dimensions listed above are exemplary; other applications may employ different dimensions.

In an exemplary embodiment, the panel 20 is supported by the bracket 30 such that the amount the system protrudes above the surface 10A is the combined thickness of the bracket 30 and the gasket 32.

Figure 5:
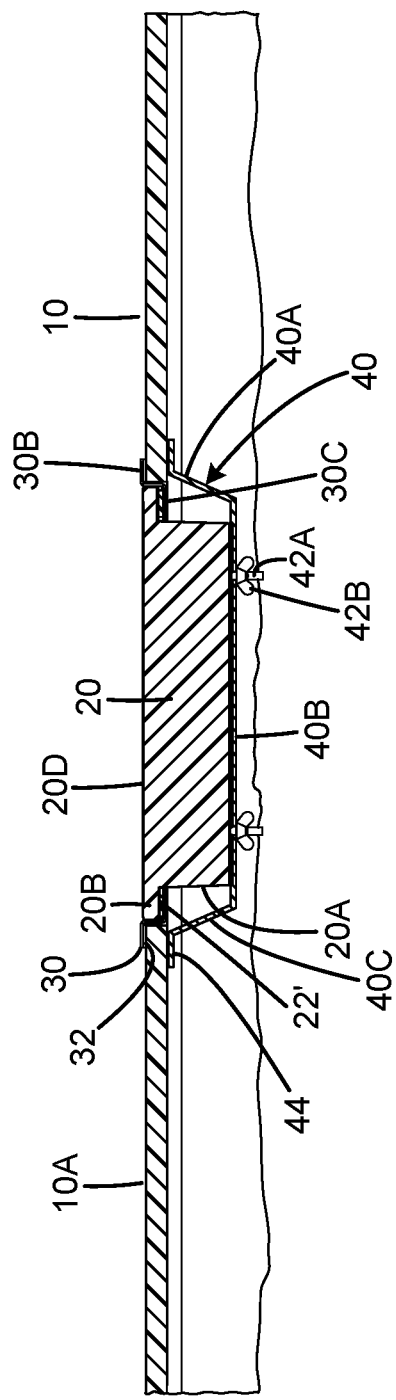
FIG. 5 diagrammatically illustrates an alternative embodiment of a flush-mounted panel system for a bathing installation.
Figure 5A:
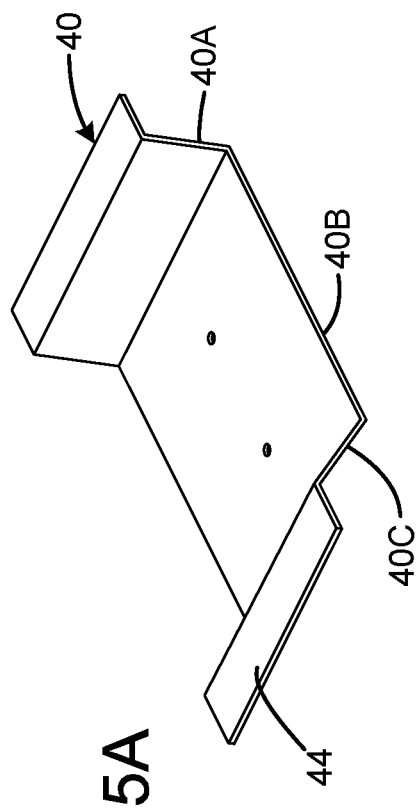
FIG. 5A is a diagrammatic isometric view of the support bracket of FIG. 5.

FIG. 5 is a diagrammatic cross-sectional depiction of an alternate embodiment of a flush-mounted panel system. This embodiment employs a bracket 30 as in the embodiment of FIGS. 1-4. A second, undersurface bracket 40 is provided on the underside of the tub 10. FIG. 5A illustrates an exemplary embodiment of the bracket 40 in isolation. The panel 20 is provided with threaded screws 42A and nuts 42B. The bracket 40 includes a top lip portion 44, and the width of the bracket at the top 40A of the bracket is larger than the opening 14. The bracket 40 has a base 40B bridging the bottom surface of the panel 20, and a side portion 40C. With the panel placed within the opening and supported by the bracket 30, the screws 42A protruding downwardly from the panel housing are passed through openings or slots formed in base 40B of the bracket, and the nuts 42B tightened to draw the panel downwardly to secure the panel in place. A gasket 22' such as a double-sided tape or rubber is placed between the flange 20B of the panel and the bottom lip 30C of the bracket 30. A waterproof gasket 32 is between the top lip 30B and the surface 10A, as with the embodiment of FIGS. 1-4.

Although the foregoing has been a description and illustration of specific embodiments of the subject matter, various modifications and changes thereto can be made by persons skilled in the art without departing from the scope and spirit of the invention.

What is claimed is:

1. A flush-mounted control panel system for a bathing installation having a mounting surface with an opening defined therein, the panel system including:
    a control panel including a housing structure, the housing structure including a peripheral flange, the panel, housing and flange sized to fit within the opening;
    a support bracket for mounting and supporting the control panel within the opening, the support bracket fabricated of a thin material including:
    a peripheral sidewall portion having a height dimension;
    a top lip portion extending outwardly from the sidewall portion;
    a bottom lip portion extending inwardly from the sidewall portion;
    the top lip portion and the bottom lip portion extending along generally parallel planes such that the top lip portion overlays a portion of the mounting surface peripheral to the opening and the bottom lip portion underlays the peripheral flange of the panel housing structure to support the panel within the opening;
    a first adhesive seal fitted between an edge of the opening and the top lip portion of the support bracket to secure the bracket to the mounting surface;
    a second adhesive seal fitted between the peripheral flange and the bottom lip portion to secure the panel flange to the bottom lip portion;
    wherein the height dimension of the peripheral sidewall is selected such that a top surface of the panel does not protrude above the top lip portion of the support bracket with the panel, support bracket and first and second adhesive seals assembled together with the mounting surface.

2. The panel system of claim 1 wherein the first and second adhesive seals include waterproof adhesives.

3. The panel system of claim 1 wherein the first and second adhesive seals comprise thin gaskets.

4. The panel system of claim 1 wherein the first and second adhesive seals comprise double-side tape.

5. The panel system of claim 1, wherein the bracket is a unitary one-piece structure comprising the top lip portion, the bottom lip portion and the sidewall portion.

6. The panel system of claim 5, wherein the bracket is a stainless steel bracket.

7. The panel system of claim 5, wherein the bracket is a molded plastic bracket.

8. The panel system of claim 1, wherein the height dimension of the peripheral sidewall portion of the bracket is nominally equal to a thickness of the peripheral flange of the housing structure.

9. A flush-mounted control panel system for a bathing installation having a mounting surface with an opening defined therein, the panel system including:
    a control panel including a housing structure, the housing structure including a peripheral flange, the panel, housing and flange sized to fit within the opening of the mounting surface;
    a support bracket for mounting and supporting the control panel within the opening, the support bracket fabricated of a thin material and including:
    a peripheral sidewall portion having a height dimension;
    a top lip portion extending outwardly from the sidewall portion;
    a bottom lip portion extending inwardly from the sidewall portion;
    the top lip portion and the bottom lip portion extending along generally parallel planes such that the top lip portion overlays a portion of the surface peripheral to the opening and the bottom lip portion underlays the peripheral flange of the panel housing structure to support the panel within the opening;
    one or more threaded fasteners extending downwardly from the panel housing structure;
    an undersurface bracket configured to fit under the mounting surface and the panel housing structure, the undersurface bracket including a sidewall portion connecting a base portion and a top flange portion, the base portion including one or more openings or slots configured to receive the one or more threaded fasteners; and
    one or more nuts configured to engage the one or more threaded fasteners to secure the panel in place on the mounting bracket,
    wherein the height dimension of the support bracket sidewall portion is selected such that a top surface of the panel does not protrude above the top lip portion of the support bracket with the panel and support bracket assembled together with the mounting surface.

10. The panel system of claim 9, wherein the support bracket is a unitary one-piece structure comprising the top lip portion, the bottom lip portion and the sidewall portion.

11. The panel system of claim 10, wherein the support bracket is a stainless steel bracket.

12. The panel system of claim 9, wherein the support bracket is a molded plastic bracket.

13. The panel system of claim 9, wherein the height dimension of the sidewall portion of the support bracket is nominally equal to a thickness of the peripheral flange of the housing structure.

14. The panel system of claim 9, further comprising a waterproof seal positioned between the peripheral flange of the housing structure and the bottom lip of the support bracket.

15. The panel system of claim 14, wherein the waterproof seal comprises a gasket formed of a double-sided adhesive tape.

16. A flush-mounted control panel system for a bathing installation having a mounting surface with an opening defined therein, the panel system including:
   a control panel including a housing structure, the housing structure including a peripheral flange, the panel, housing and flange sized to fit within the opening of the mounting surface;
   a support bracket for mounting and supporting the control panel within the opening, the support bracket fabricated of a thin material including:
   a peripheral sidewall portion having a height dimension;
   a top lip portion extending outwardly from the sidewall portion;
   a bottom lip portion extending inwardly from the sidewall portion;
   the top lip portion and the bottom lip portion extending along generally parallel planes such that the top lip portion overlays a portion of the surface peripheral to the opening and the bottom lip portion underlays the peripheral flange of the housing structure to support the panel within the opening;
   wherein the height dimension of the sidewall portion is selected such that a top surface of the panel does not protrude above the top lip portion of the support bracket with the panel and support bracket assembled together on the mounting surface;
   a mount system to secure the assembled support bracket and panel in place within the opening.

17. The panel system of claim 16, wherein the mount system includes:
   a first adhesive gasket sized to fit between an edge of the opening and the top lip portion of the support bracket to secure the support bracket to the mounting surface; and
   a second adhesive gasket sized to fit between the peripheral flange of the housing structure and the bottom lip portion to secure the peripheral flange of the housing structure to the bottom lip portion.

18. The panel system of claim 16, wherein the mount system comprises:
   one or more threaded fasteners extending downwardly from the panel housing;
   an undersurface bracket configured to fit under the mounting surface and the panel housing structure, the undersurface bracket including a sidewall portion connecting a base portion and a top flange portion, the base portion including one or more openings or slots configured to receive the one or more threaded fasteners; and
   one or more nuts configured to engage the one or more threaded fasteners to secure the panel in place on the support bracket.

19. The panel system of claim 16, wherein the support bracket is a unitary one-piece structure comprising the top lip portion, the bottom lip portion and the sidewall portion.

20. The panel system of claim 19, wherein the support bracket is a stainless steel structure.

* * * * *